(12) United States Patent
Takei et al.

(10) Patent No.: US 7,896,721 B2
(45) Date of Patent: Mar. 1, 2011

(54) METHOD OF MANUFACTURING AN ORGANIC ELECTROLUMINESCENCE DEVICE USING A LIQUID DROPLET EJECTION METHOD

(75) Inventors: Shuichi Takei, Shimosuwa-machi (JP); Masaki Ito, Fujimi-machi (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 135 days.

(21) Appl. No.: 12/392,661

(22) Filed: Feb. 25, 2009

(65) Prior Publication Data

US 2009/0215350 A1  Aug. 27, 2009

(30) Foreign Application Priority Data

Feb. 26, 2008 (JP) ............................. 2008-044374
Nov. 13, 2008 (JP) ............................. 2008-291349

(51) Int. Cl.
*H01J 9/00* (2006.01)
*B05D 1/06* (2006.01)

(52) U.S. Cl. .......................................... 445/23; 427/66
(58) Field of Classification Search ............. 445/23–25; 427/66, 71, 256, 466, 472, 474, 510
See application file for complete search history.

(56) References Cited

FOREIGN PATENT DOCUMENTS

JP   A-2001-195008   7/2001
JP   A-2003-123988   4/2003

OTHER PUBLICATIONS

Crispin, et al., "The Origin of the High Conductivity of Poly (3,4-ethylenedioxythiophene)—Poly(styrenesulfonate) (PEDOT-PSS) Plastic Electrodes," *Chem. Mater.* (Aug. 2, 2006), pp. 4354-4360, vol. 18, American Chemical Society.

Mori, "Latest technical trend of organic electronics, Plastic electronics produced by laser printer," Electronic Materials and Parts, (Jul. 2007), pp. 43-47, Kogyo Chosakai Publishing, Inc. (with partial translation.).

*Primary Examiner*—Joseph L Williams
(74) *Attorney, Agent, or Firm*—Oliff & Berridge, PLC

(57) ABSTRACT

There is provided a method of manufacturing an organic electroluminescence device including a plurality of light-emitting elements. The organic electroluminescence device includes a partition wall layer having a first partition wall layer with openings corresponding to the light-emitting elements and a second partition wall layer which is disposed on the first partition wall layer, the partition wall layer extends so as to follow the gap of the light-emitting elements, and has a groove on the top. The method of manufacturing includes forming the partition wall layer by forming the first partition wall layer and forming the second partition wall layer on the first partition wall layer such that the first partition wall layer is exposed at the bottom of the groove. The first partition wall layer is composed of an inorganic material, and the second partition wall layer is composed of an organic material.

12 Claims, 9 Drawing Sheets

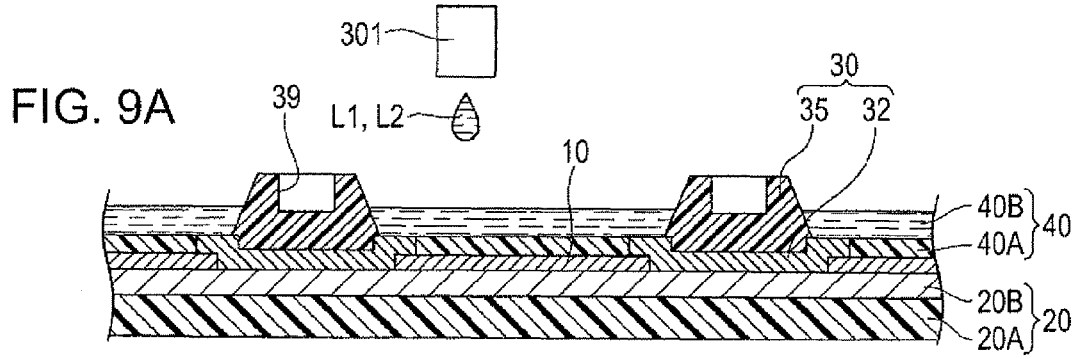
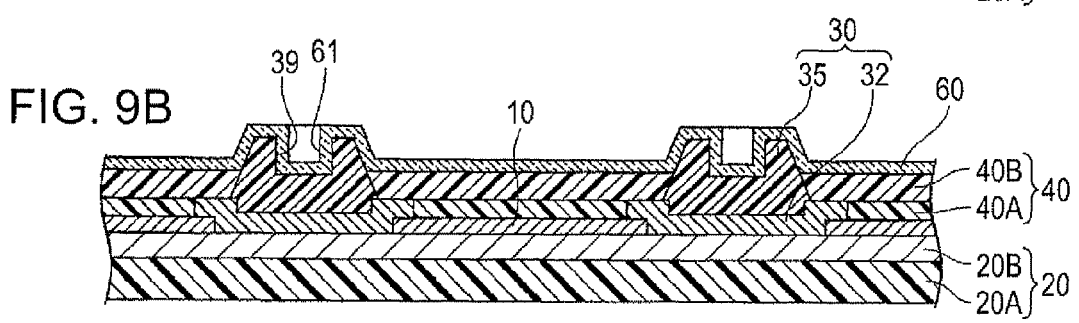
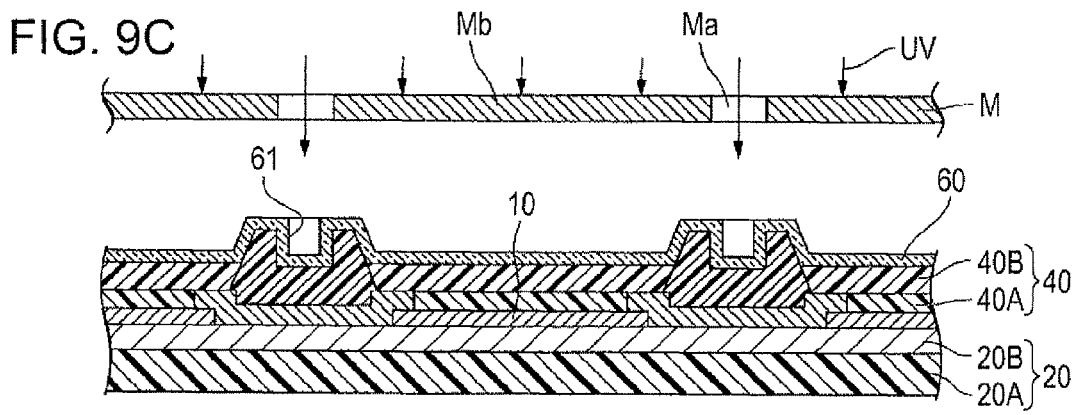
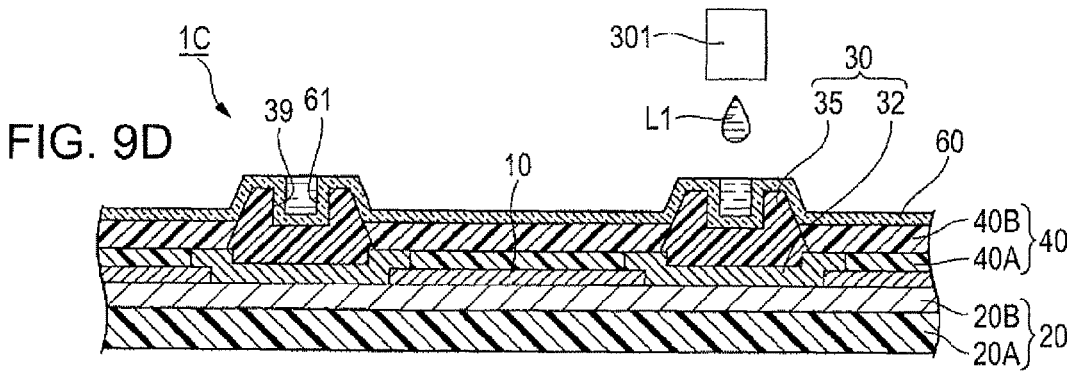

METHOD OF MANUFACTURING AN ORGANIC ELECTROLUMINESCENCE DEVICE USING A LIQUID DROPLET EJECTION METHOD

BACKGROUND

1. Technical Field

The present invention relates to a method of manufacturing an organic electroluminescence device.

2. Related Art

In recent years, with the diversification of information apparatuses, etc., there have been increased needs for flat display devices with low power consumption and reduced weight. As one type of such flat display devices, organic EL devices have been proposed, in which organic electroluminescence (hereinafter referred to as "organic EL") elements having organic functional layers, such as a luminescent layer and a hole transport layer, emit light so that a display operation is performed.

Two types of organic EL devices are known: namely, a top emission type in which light emitted by organic EL elements is extracted from a side opposite the substrate having the organic EL elements, and a bottom emission type in which light is extracted from the substrate side. When these two emission types are compared, in the organic EL device of a top emission type, the pixel aperture ratio can be easily increased, which is advantageous in achieving higher definition and higher quality of displayed images.

In an organic EL device of a top emission type, an electrode (cathode), which is located on the side from which light from the luminescent layer is emitted, is formed so as to be light-transmissive. Specifically, a light-transmissive electrode (transparent cathode) is formed by a method in which a transparent conductive material, such as indium tin oxide (ITO), is used, or by a method in which, using a metal material, such as silver or aluminum, a thin film is formed with a small thickness to such an extent that light transmission is achieved.

However, such a transparent cathode has high electrical resistance due to physical properties of the constituent material itself and the small conductor cross-sectional area of the thin, transparent cathode. Consequently, the value of current flowing into the organic EL elements provided in the organic EL device may change depending on the position where the elements are placed, resulting in occurrence of display unevenness, such as uneven light emission and uneven luminance, in displayed images.

Under these circumstances, there have been proposals to eliminate display unevenness by forming an auxiliary line that assists electrical conduction so that the electrical resistance of the entire electrode including the transparent cathode and the auxiliary line is substantially decreased. For example, JP-A-2003-123988 and JP-A-2001-195008 each disclose a configuration in which an auxiliary line composed of a metal material having low resistance, such as aluminum or chromium, is formed on the top surface of a partition wall surrounding organic EL elements, and a transparent cathode is formed over the entire surface so as to overlie the auxiliary line.

Meanwhile, the manufacturing method of the organic EL element differs depending on whether the organic functional layer is formed using a low-molecular-weight material or a high-molecular-weight material. In many cases, low-molecular-weight materials contain molecules with a rigid skeleton and have low solubility in an organic solvent. Therefore, when a low-molecular-weight material is used for the organic functional layer, vapor phase reaction, such as vacuum deposition, is used. On the other hand, in many cases, high-molecular-weight materials have relatively high solubility in an organic solvent. Therefore, when a high-molecular-weight material is used for the organic functional layer, a wet coating method is used in which a liquid (functional liquid) containing an organic functional layer-forming material is applied/placed at a predetermined position, and the solvent is evaporated, thereby to form a film (functional film) composed of a desired material.

One of known examples of the wet coating method that can be effectively used for the manufacture of organic EL elements is a liquid droplet ejection method. In particular, an ink jet method has various advantages, such as there being no need for use of a mask in patterning, having a capability of applying different types of liquids with high resolution, there being little loss of ink, and ease of large area coating. Consequently, the ink jet method is suitable for forming a functional film in which a fine pattern, for example, a fine RGB pattern for full-color display, is formed using different liquids, and thus it is possible to obtain a high-resolution, high-quality organic EL device.

In the manufacturing method using the liquid droplet ejection method, in order to define regions in which the respective functional liquids are to be placed, a partition wall is disposed so as to surround each region to which the corresponding functional liquid is to be applied. By providing the partition wall, positional accuracy can be improved, and an applied functional liquid can be prevented from being mixed with a functional liquid applied to another region. In order to ensure patterning, desirably, the partition wall has liquid-repellency with respect to the functional liquids, and the regions to which the functional liquids are applied have liquid-affinity with respect to the functional liquids.

However, when an organic EL device having an auxiliary line provided on the partition wall is manufactured using the liquid droplet ejection method, the following problems arise. That is, when the liquid droplet ejection method is carried out using the partition wall, the top surface of the partition wall is required to be kept liquid-repellent in order to ensure patterning. However, if the auxiliary line is formed using a metal material, the top surface of the partition wall becomes liquid-philic, which may result in difficulty in performing a reliable patterning process.

SUMMARY

An advantage of some aspects of the invention is that it provides a method of manufacturing an organic EL device in which, using a liquid droplet ejection method, an organic EL device provided with an auxiliary line can be manufactured satisfactorily.

According to a first aspect of the invention, there is provided a method of manufacturing an organic electroluminescence device including light-emitting elements including a first electrode, each of the light-emitting elements having second electrodes and an organic functional layer disposed between the first electrode and the corresponding one of the second electrodes, the organic functional layer including a luminescent layer; a partition wall layer extending so as to follow a gap between the light-emitting elements; and an auxiliary line connected to one of the first and second electrodes so as to assist electrical conduction to the light-emitting elements, the method comprising: forming the partition wall layer; forming a groove in the top of the partition wall layer; subjecting the inside of the groove to liquid-affinity-imparting treatment; subjecting at least the top of the partition wall layer to liquid-repellency-imparting treatment; forming the auxiliary line to extend following the groove by using a liquid droplet ejection method to eject a conductive ink, in which a conductive material is dissolved or dispersed in a solvent, into the groove; and forming the one of the electrodes in contact with the auxiliary line.

In such a method, since the conductive ink is repelled by the partition wall having the liquid-repellent top, the conductive ink is prevented from spreading or remaining on the top of the partition wall layer, and it is possible to apply different types of liquid satisfactorily using the liquid droplet ejection method, and thus each liquid can be applied to the corresponding pixel with accuracy. Furthermore, since the conductive ink containing the conductive material placed in the groove spreads over the liquid-philic bottom surface, the auxiliary line can be reliably formed along the groove, and the auxiliary line can be placed with high positional accuracy. Consequently, both placement of the auxiliary line and application of different types of liquid to the corresponding pixels can be performed satisfactorily, and thus it is possible to manufacture a high-definition, high-quality organic EL device without uneven luminance.

According to a second aspect of the invention, there is provided a method of manufacturing an organic electroluminescence device including light-emitting elements including a first electrode, each of the light-emitting elements having a pair of electrodes and an organic functional layer disposed between the first electrode and the corresponding one of the second electrodes, the organic functional layer including a luminescent layer; a partition wall layer extending so as to follow a gap between the light-emitting elements; and an auxiliary line connected to one of the first and second electrodes so as to assist electrical conduction to the light-emitting elements, the method comprising: forming the partition wall layer; forming a groove in the top of the partition wall layer; forming the first electrode over and into the groove such that the electrode follows a cross-sectional shape of the underlying groove so that the first electrode has an indentation that corresponds to the groove; subjecting the surface of the first electrode in the indentation to liquid-affinity-imparting treatment; and forming the auxiliary line to extend following the indentation in the first electrode by ejecting, using a liquid droplet ejection method, a conductive ink, in which a conductive material is dissolved or dispersed in a solvent.

In such a method, a recess is formed in the surface of the one of the electrodes, the recess following the shape of the underlying groove, and the conductive ink containing the conductive material spreads in the recess which has been subjected to liquid-affinity-imparting treatment. Thereby, the auxiliary line can be reliably formed along the groove provided in the top of the partition wall, and the auxiliary line can be placed with high positional accuracy. Consequently, both placement of the auxiliary line and application of different types of ink to the corresponding pixels can be performed satisfactorily, and thus it is possible to manufacture a high-definition, high-quality organic EL device without uneven luminance.

In the method according to the first aspect of the invention, preferably, wherein the partition wall layer includes a first partition wall layer having openings corresponding to the light-emitting elements and a second partition wall layer which is disposed on the first partition wall layer, and extending so as to follow the gap of the light-emitting elements, and has the groove on the top thereof; the forming the partition wall layer includes forming the first partition wall layer and forming the second partition wall layer on the first partition wall layer such that the first partition wall layer is exposed at the bottom of the groove; and the first partition wall layer is composed of an inorganic material, and the second partition wall layer is composed of an organic material. In such a case, by forming each of the portion to which liquid-repellency is imparted and the portion to which liquid-affinity is imparted using the material suitable for the corresponding properties, it is possible to easily control liquid-affinity and liquid-repellency, and the auxiliary line can be formed reliably.

Preferably, the organic functional layer includes a hole injection layer, and the auxiliary line and the hole injection layer are formed using a common material. In this case, by using the common material, the manufacturing process and facilities can be simplified, and thus it is possible to manufacture a high-quality organic EL device with reduced process load.

The hole injection layer is formed during the same process as the auxiliary line. In such a case, by simultaneously forming the auxiliary line and the hole injection layer, the number of process steps can be reduced, and it is possible to manufacture a high-quality organic EL device with reduced process load.

In this case, preferably, the conductive material is a mixture of polyethylenedioxythiophene (PEDOT) and polystyrene sulfonic acid (PSS); the solvent is a mixed solvent of water and an organic substance that decreases the resistance of the conductive material when mixed with water; and the resistance of the conductive material is controlled by changing the mixing ratio of the mixed solvent. With respect to PEDOT/PSS having good compatibility with water, generally, water is used as a solvent. However, there have been reports on organic substances, such as diethylene glycol (DEG), that can decrease the resistance of PEDOT/PSS when mixed with water compared with the case where only water is used as the solvent (for example, refer to Chem. Mater., 18(18), 4354-4360, 2006). When a mixed solvent into which such an organic substance has been mixed is used, the resistance of the resulting PEDOT/PSS polymer layer decreases, thus facilitating conduction. Furthermore, PEDOT/PSS is widely used as the material for forming hole injection layers. Therefore, according to this method, while using the same material for forming the conductive material and the hole injection layer, by appropriately adjusting the solvent for the conductive ink for forming the auxiliary line, it is possible to distinguish the hole injection layer having suitable resistance from the auxiliary line.

Preferably, before forming the organic functional layer, the auxiliary line is formed and the groove is filled with the resulting auxiliary line. In such a case, since the groove is filled with the resulting auxiliary line, the recessed shape is eliminated from the partition wall layer. Therefore, in the process of forming the organic functional layer, even if the functional liquid is placed on the partition wall layer, the functional liquid does not remain on the partition wall layer and flows into the openings corresponding to the light-emitting elements, and thus selective application can be performed satisfactorily. Consequently, it is possible to manufacture a high-quality organic EL device.

Preferably, before forming the auxiliary line, a region in which the conductive ink is to be placed is selectively irradiated with ultraviolet light. In such a case, it is possible to impart liquid-affinity to the region in which the conductive ink is to be placed, and the conductive ink can be satisfactorily applied selectively. For example, by using a photomask or the like, ultraviolet irradiation can be performed while achieving both selectivity in the irradiation region and ease of irradiation.

Preferably, the liquid droplet ejection method is an ink jet method. In such a case, the functional liquids can be applied to the corresponding regions in a high-definition pattern, and thus it is possible to manufacture a high-resolution, high-quality organic EL device.

BRIEF DESCRIPTION OF THE DRAWINGS

The invention will be described with reference to the accompanying drawings, wherein like numbers reference like elements.

FIGS. 9A to 9D are cross-sectional views showing a method of manufacturing an organic EL device according to the third embodiment.

DESCRIPTION OF EXEMPLARY EMBODIMENTS

First Embodiment

Figure 1:
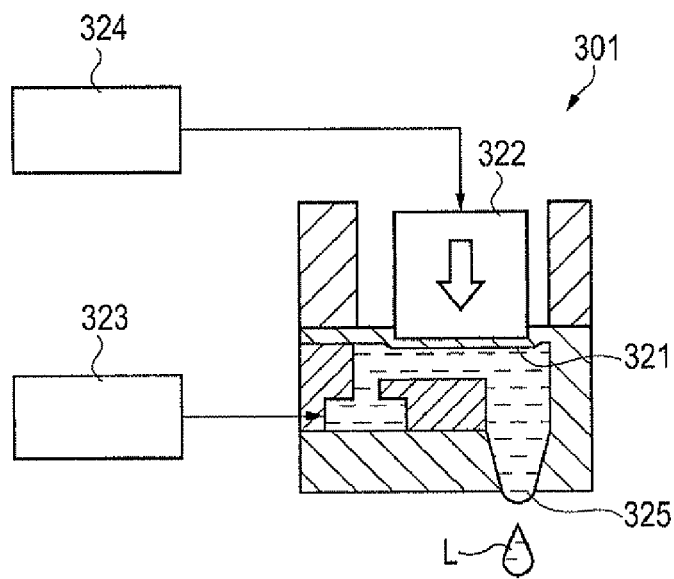
FIG. 1 is a cross-sectional view of a liquid droplet ejection head provided in a liquid droplet ejection apparatus.

An organic electroluminescence (EL) device according to a first embodiment of the invention will be described below with reference to FIGS. 1 to 5E. In the drawings, in order to make the individual layers and components recognizable, different scales are used for the individual layers and components. In this embodiment, an ink jet method, which is an example of the liquid droplet ejection method, is used for the manufacture of the organic EL device. Consequently, an outline of the ink jet method will be described first, and then the organic EL device according to this embodiment will be described.

FIG. 1 is a cross-sectional view of a liquid droplet ejection head 301 provided in an apparatus (liquid droplet ejection apparatus) used for the ink jet method. The liquid droplet ejection head 301 is a multi-nozzle type liquid droplet ejection head having a plurality of ejection nozzles. The plurality of ejection nozzles are arrayed in one direction at a predetermined pitch on the lower surface of the liquid droplet ejection head 301. Liquid droplets L of a liquid material are ejecting from the ejection nozzles of the liquid droplet ejection head 301. The liquid material in this embodiment corresponds to a functional liquid containing an organic functional layer-forming material or a conductive ink containing a conductive material. The amount of one droplet ejected in this embodiment is, for example, 1 to 300 nanograms.

In this embodiment, the ejection technique using an electromechanical conversion method is employed in the liquid droplet ejection head 301. In this method, a piezoelectric element 322 is disposed adjacent to a liquid chamber 321 containing a liquid material. The liquid material is supplied to the liquid chamber 321 through a liquid material supply system 323 including a material tank containing the liquid material. The piezoelectric element 322 is connected to a driving circuit 324. A voltage is applied to the piezoelectric element 322 through the driving circuit 324 to deform the piezoelectric element 322. Thereby, the liquid chamber 321 is deformed, and the internal pressure is increased, resulting in ejection of a liquid droplet L of the liquid material from a nozzle 325. In this case, by changing the applied voltage, the deformation amount of the piezoelectric element 322 is controlled, and the ejection amount of the liquid material is controlled.

Examples of the ejection technique of the ink jet method include, in addition to the electromechanical conversion method, an electrification control method, a pressure oscillation method, an electrothermal conversion method, and an electrostatic absorption method, all of which can be suitably used. In the electrification control method, an electric charge is applied to the material by an electrification electrode, and the material is ejected from a nozzle with the flying direction of the material being controlled by a deflection electrode. In the pressure oscillation method, a superhigh voltage, for example, about 30 kg/cm$^2$, is applied to the material, and the material is ejected from the front end of the nozzle. In the electrothermal conversion method, the material is rapidly evaporated to generate bubbles by a heater disposed in the space where the material is stored, and the material in the space is ejected by the pressure of the bubbles. In the electrostatic absorption method, a very weak pressure is applied to the space where the material is stored, a meniscus of the material is formed at the nozzle, and an electrostatic attractive force is applied in this state, thereby ejecting the material from the tip of the nozzle. In addition, a method of using a change in viscosity of a fluid due to an electric field, and a method in which the material is ejected by an electrical discharge spark can also be employed.

An example of an organic EL device 1A according to this embodiment will now be described with reference to FIGS. 2 to 5E. First, the structure of the organic EL device 1A will be described with reference to FIGS. 2 to 4B, and then a manufacturing method will be described with reference to FIGS. 5A to 5E.

Figure 2:
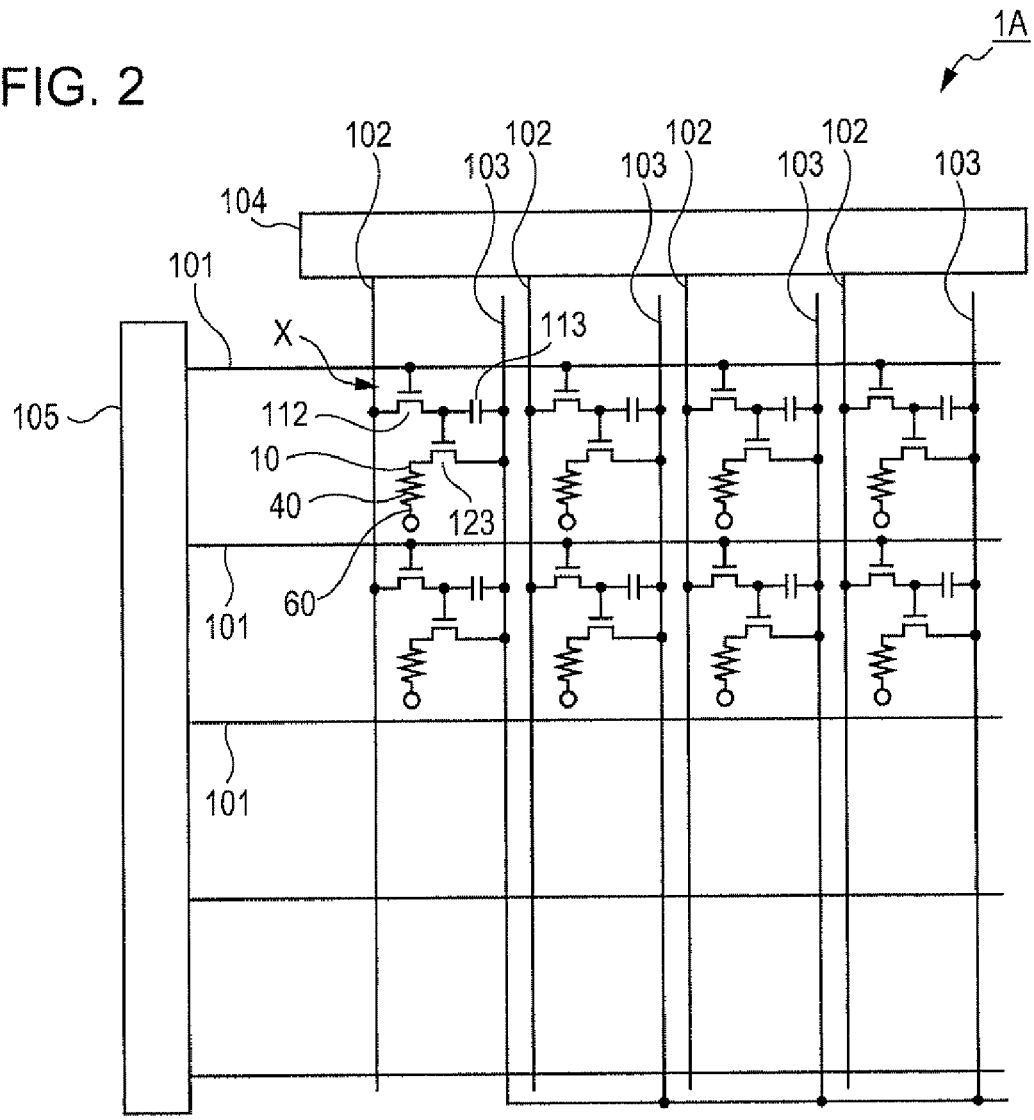
FIG. 2 is a schematic diagram showing a wiring structure of an organic EL device according to a first embodiment of the invention.

FIG. 2 is a schematic diagram showing a wiring structure of an organic EL device 1A according to this embodiment. The organic EL device 1A is an active matrix-type device in which thin-film transistors (hereinafter referred to as "TFTs") are used as switching elements. The organic EL device 1A has a wiring structure in which a plurality of scanning lines 101, a plurality of signal lines 102 extending in a direction orthogonal to the scanning lines 101, and a plurality of power lines 103 extending parallel to the signal lines 102 are arranged. A sub-pixel X is disposed in the vicinity of each of the intersections of the scanning lines 101 and the signal lines 102.

The signal lines 102 are connected to a data line driving circuit 104 having shift registers, level shifters, video lines, and analog switches. The scanning lines 101 are connected to a scanning line driving circuit 105 having shift registers and level shifters.

Each sub-pixel X includes a switching TFT 112 in which a scanning signal is supplied to the gate electrode through the scanning line 101, a storage capacitor 113 which stores a pixel signal supplied from the signal line 102 through the switching TFT 112, a driving TFT 123 in which the pixel signal stored in the storage capacitor 113 is supplied to the gate electrode, an anode (pixel electrode) 10 into which driving current flows from the power line 103 when electrically connected to the power line 103 via the driving TFT 123, and a light-emitting portion 40 sandwiched between the pixel electrode 10 and a common electrode 60.

In the organic EL device 1A, when the scanning line 101 is driven and the switching TFT 112 is turned on, the potential of the signal line 102 at that time is stored in the storage capacitor 113, and an on/off state of the driving TFT 123 is determined in accordance with a state of the storage capacitor 113. Current flows from the power line 103 into the pixel electrode 10 through the channel of the driving TFT 123, and then flows into the common electrode 60 through the light-emitting portion 40. The light-emitting portion 40 emits light in accordance with the amount of the current flowing therethrough.

Figure 3:
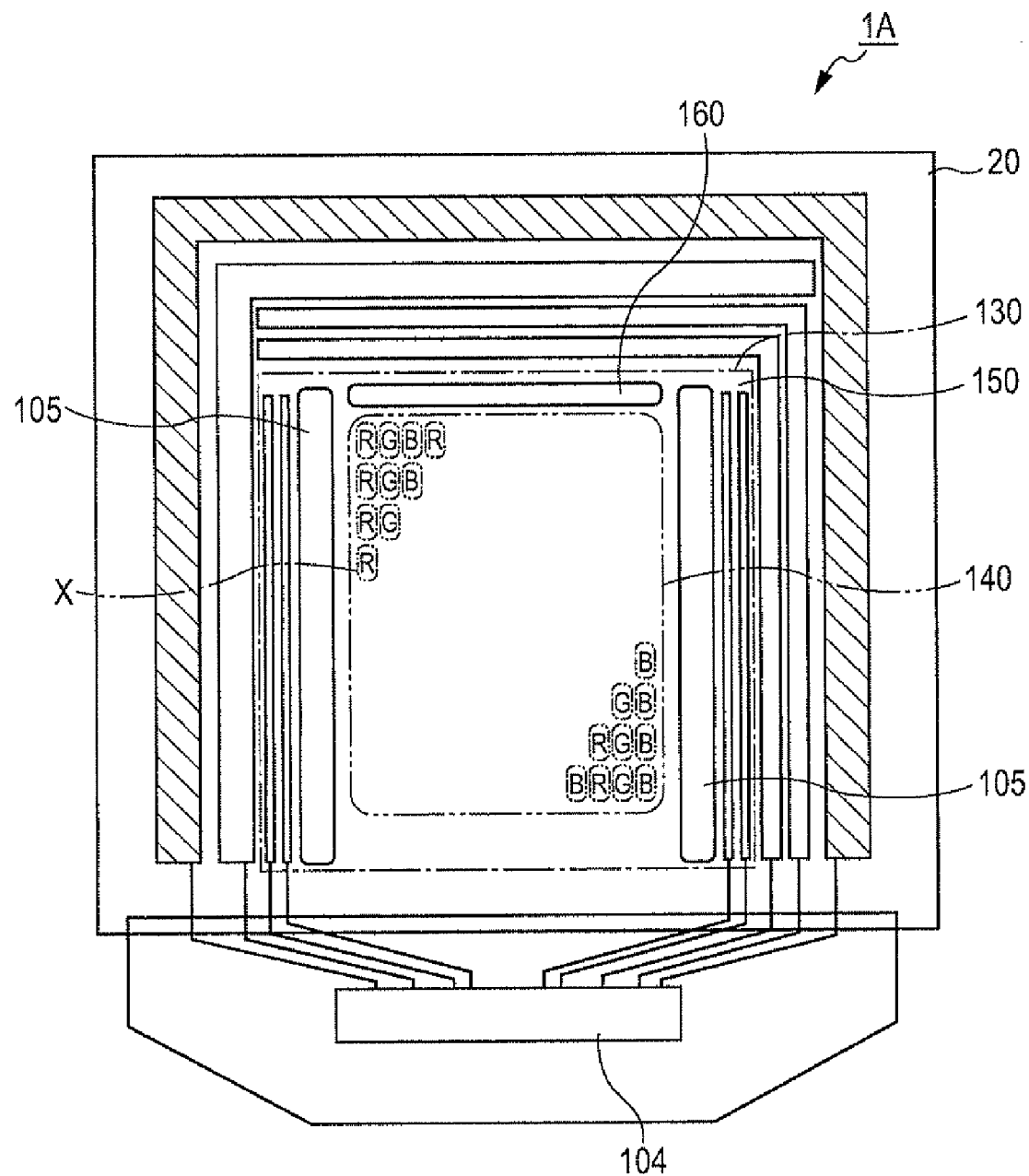
FIG. 3 is a plan view schematically showing the structure of the organic EL device according to the first embodiment.

FIG. 3 is a plan view schematically showing the structure of the organic EL device 1A. As shown in FIG. 3, the organic EL device 1A includes a substrate 20 having a light-transmitting property and an electrical insulating property and a pixel portion 130 (defined to be within the frame shown by the one-dot chain line in FIG. 3) which is located in the substantially center portion of the substrate 20 and which is substantially rectangular in plan view. The pixel portion 130 is divided into an actual display region 140 (defined to be within the frame shown by the two-dot chain line in FIG. 3) in which the sub-pixels X are arrayed in a matrix and a dummy region 150 (region between the one-dot chain line and the two-dot chain line) disposed in the periphery of the actual display region 140.

The light-emitting portion 40 in each sub-pixel X emits light, and any one of red (R) light, green (G) light, and blue (B) light can be extracted. The individual light-emitting portions 40 may directly emit the corresponding color lights. Alternatively, a configuration may be used in which white light emitted by the light-emitting portions 40 is transmitted through color filters corresponding to R, G, and B so as to be modulated into the individual color lights. In the actual display region 140, the sub-pixels X are arrayed so that the sub-pixels X of the same color are arranged in the longitudinal direction in the drawing, which is referred to as a stripe arrangement. In the actual display region 140, by mixing RGB color lights emitted by the sub-pixels X arrayed in a matrix, full color display can be performed.

Referring to FIG. 3, scanning line driving circuits 105 are disposed on both sides of the actual display region 140. The scanning line driving circuits 105 are disposed as lower layers with respect to the dummy region 150. A testing circuit 160 is disposed on the upper side of the actual display region 140. The testing circuit 160 is disposed as a lower layer with respect to the dummy region 150. The testing circuit 160 tests the operation of the organic EL device 1A and, for example, includes a test information output unit (not shown) that outputs the testing results so that the quality and defects of the display device can be tested during the manufacturing process or at the time of shipment.

Figure 4A:
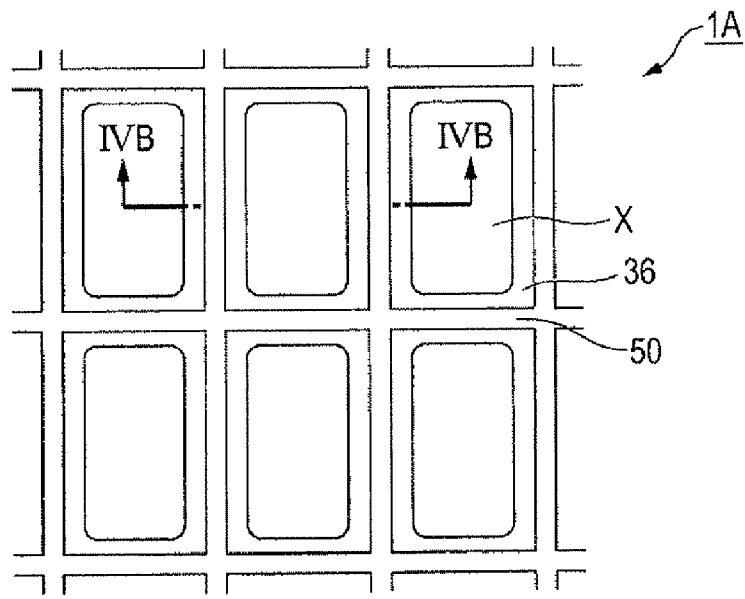
FIG. 4A is an enlarged plan view showing sub-pixels X and their periphery provided in the organic EL device according to the first embodiment.
Figure 4B:
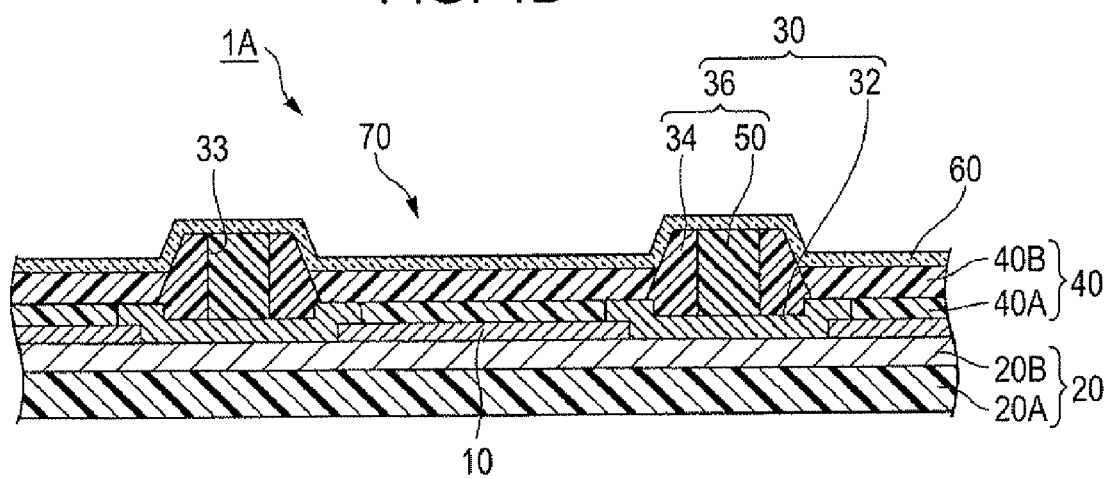
FIG. 4B is an enlarged cross-sectional view taken along the line IVB-IVB of FIG. 4A.

FIG. 4A is an enlarged plan view showing sub-pixels X and their periphery provided in the organic EL device 1A, and FIG. 4B is a cross-sectional view taken along the line IVB-IVB of FIG. 4A and viewed in the direction of the arrow.

As shown in FIG. 4A, the organic EL device 1A according to this embodiment includes a plurality of sub-pixels X which are substantially rectangular in plan view, and each sub-pixel X is surrounded by a second partition wall layer 34. An auxiliary line 50 is arranged, between the second partition wall layers 34, in a matrix. In each sub-pixel X, the auxiliary line 50 surrounds the second partition wall layer 34. Although the auxiliary line 50 is arranged in a matrix in this embodiment, the auxiliary line 50 may be arranged in a stripe pattern only in the longitudinal direction or in the lateral direction in the drawing.

As shown in FIG. 4B, the organic EL device 1A includes a substrate 20, pixel electrodes 10 disposed on the substrate 20, a partition wall layer 30 having openings overlying the corresponding pixel electrodes 10 in plan view, light-emitting portions 40 disposed in the corresponding regions surrounded by the partition wall layer 30, and a common electrode 60 disposed over the entire upper surface so as to cover the partition wall layer 30 and the light-emitting portions 40. Each pixel electrode 10, the corresponding light-emitting portion 40, and the common electrode 60 constitute an organic EL element (light-emitting element) 70. The organic EL device 1A according to this embodiment employs a top emission type structure in which light generated by the organic EL elements 70 is emitted toward the common electrode 60 side.

The partition wall layer 30 includes a first partition wall layer 32 having openings overlying the corresponding pixel electrodes 10 in plan view, and a common partition wall layer 36 disposed on the first partition wall layer 32. Furthermore, the common partition wall layer 36 includes a second partition wall layer 34 which is divided by a groove 33 extending from the top to the first partition wall layer 32, and an auxiliary line 50 disposed so as to be embedded in the groove 33. In each light-emitting portion 40, a hole injection layer (organic functional layer) 40A which facilitates injection of holes from the pixel electrode 10 and a luminescent layer (organic functional layer) 40B are stacked in that order.

Hereinafter, the positional relationships and deposition relationships among the components will be described under the assumption that the side on which the substrate 20 is disposed is a lower side, and the side on which the common electrode 60 is disposed is an upper side. The individual components will be described below.

The substrate 20 includes a substrate body 20A and an element layer 20B disposed on the substrate body 20A, the element layer 20B including lines, driving elements, etc. The substrate body 20A may be a transparent substrate or a non-transparent substrate. Examples of the non-transparent substrate include a ceramic, such as alumina; a metal sheet composed of stainless steel or the like which has been subjected to insulation treatment, such as surface oxidation; and a thermosetting resin, a thermoplastic resin, and a film (plastic film) thereof. Examples of the material for the transparent substrate include inorganic substances, such as glass, quartz glass, and silicon nitride; and organic polymers (resins), such as an acrylic resin and a polycarbonate resin. Furthermore, a composite material produced by laminating or mixing the materials described above may be used as long as it has a light-transmitting property. In this embodiment, the non-transparent plastic film is used as the material for the substrate body 20A.

The element layer 20B includes various types of lines for driving the organic EL device 1A, the driving elements, such as switching TFTs and driving TFTs, shown in FIG. 2, and insulating films composed of an inorganic substance or an organic substance. The various types of lines and the driving elements can be appropriately formed by patterning by photolithography, followed by etching, and the insulating films can be appropriately formed by a known method, such as vapor deposition or sputtering. For example, when the substrate body 20A is composed of a transparent material or a top emission type is employed, according to need, a light reflection film is formed using a metal material, such as aluminum, between the substrate body 20A and the pixel electrode 10 so that light is prevented from being emitted toward the substrate body 20A side (lower side) and light is emitted from the upper side.

In each pixel, the pixel electrode 10 is disposed on the element layer 20B. A material with a work function of 5 eV or more can be used for forming the pixel electrode 10. Such a material has a high hole injection effect, thus being preferable as the material for forming the pixel electrode 10. Examples of such a material include metal oxides, such as indium tin oxide (ITO). In this embodiment, ITO is used.

The first partition wall layer 32 is formed on the element layer 20B so as to partially rise and overlap the edges of the pixel electrodes 10. The first partition wall layer 32 has openings corresponding to the pixel electrodes 10, and the pixel electrodes 10 are exposed to inside of the openings. The first partition wall layer 32 is composed of an inorganic insulating material, such as silicon oxide ($SiO_2$), silicon nitride (SiN), or silicon oxynitride (SiON). The first partition wall layer 32 can be formed by a known method, such as etching through a mask corresponding to the openings. In this embodiment, the first partition wall layer 32 is formed using $SiO_2$.

The common partition wall layer 36 is disposed on the first partition wall layer 32 so as to surround the pixel electrodes 10. The cross-sectional shape of the common partition wall layer 36 is forward tapered with respect to the pixel electrode 10. Consequently, in each space surrounded by the common partition wall layer 36, the upper side is wider than the lower side.

Furthermore, the common partition wall layer 36 disposed between the adjacent pixel electrodes 10 includes the second partition wall layer 34 having the groove 33 extending from the top to the common partition wall layer 36 to the first partition wall layer 32, and the auxiliary line 50 disposed so as to fill the groove 33. The second partition wall layer 34 is formed so as to be liquid-repellent with respect to functional liquids containing materials for forming organic functional layers, which will be described below, and conductive ink containing a conductive material. The second partition wall layer 34 is composed of, for example, a fluorine-containing resin, a photocurable acrylic resin or polyimide resin, the surface of which is subjected to liquid-repellency-imparting treatment by $CF_4$ plasma, or the like.

The auxiliary line 50 is composed of a conductive material, and is connected to a cathode contact portion which is connected to a cathode lead terminal (not shown). As the conductive material, a metal material, such as gold, silver, copper, palladium, or nickel, or a conducting polymer, such as a mixture (PEDOT/PSS) of polyethylenedioxythiophene (PEDOT) and polystyrene sulfonic acid (PSS), can be used. In this embodiment, the auxiliary line 50 is formed using PEDOT/PSS.

The hole injection layer 40A which serves as a charge transfer layer that facilitates injection of holes from the pixel electrode 10 is disposed on the surface exposed to the bottom surface of the region surrounded by the common partition wall layer 36 (in this example, on the pixel electrode 10 and part of the first partition wall layer 32). The hole injection layer 40A is formed by applying a solution of a hole injection layer-forming material (functional liquid) from the liquid droplet ejection head 301, followed by evaporation of the solvent. Examples of the material for forming the hole injection layer 40A include PEDOT/PSS, polyaniline doped with an ionic dopant (PANI), and other known materials. Examples of the solvent in which any of these materials is dissolved at the time of application include polar solvents, such as water, isopropyl alcohol, N-methylpyrrolidone, and 1,3-dimethyl-imidazolinone. In this embodiment, PEDOT/PSS is used.

The luminescent layer 40B is disposed on the hole injection layer 40A. The luminescent layer 40B is also formed by applying a solution of a material for forming the luminescent layer 40B (functional liquid), followed by evaporation of the solvent. As the material for forming the luminescent layer 40B, a known luminescent polymer material capable of emitting fluorescent light or phosphorescent light can be suitably used. Examples of such a material include derivatives of polyfluorene (PF), polyparaphenylenevinylene (PPV), polyphenylene (PP), polyparaphenylene (PPP), polyvinylcarbazole (PVK), polythiophene, polydialkylfluorene (PDAF), poly(fluorene benzothiazole) (PFBT), polyalkylthiophene (PAT), and polysilanes, such as polymethylphenylsilane (PMPS). Furthermore, these luminescent materials may be doped with a high molecular-weight material, such as a perylene-based pigment, a coumarin-based pigment, or a rhodamine-based pigment; or a low molecular-weight material, such as rubrene, perylene, 9,10-diphenylanthracene, tetraphenylbutadiene, Nile red, coumarin 6, or quinacridone.

Examples of the solvent of the functional liquid containing the material for forming the luminescent layer 40B include water, alcohols having compatibility with water, such as methanol and ethanol, N,N-dimethylformamide (DMF), N-methylpyrrolidone (NAP), dimethylimidazoline (DMI), dimethylsulfoxide (DMSO), and 2,3-dihydrobenzofuran. These solvents may be used in combination of two or more. Furthermore, the viscosity of these solvents may be adjusted by appropriately adding cyclohexylbenzene or the like.

Furthermore, an interlayer having a function of improving the luminous efficiency of the luminescent layer may be disposed between the hole injection layer 40A and the luminescent layer 40B. As the material for forming the interlayer, for example, an amine-based conducting polymer may be used, and the interlayer may be formed by applying a functional liquid containing the material by the liquid droplet ejection method. When the interlayer is disposed, it is possible to prevent the deactivation of the luminescent layer at the interface between the hole injection layer 40A and the luminescent layer 40B. Furthermore, by accelerating the injection of holes into the luminescent layer 40B, the luminous efficiency can be increased, and a longer life of the organic EL device can be obtained.

The common electrode 60 is disposed over the entire surface of the luminescent layer 40B so as to cover the top and sidewalls of the common partition wall layer 36. The common electrode 60 is composed of a transparent conductive material, such as ITO. Alternatively, the common electrode 60 may be formed as a thin film having a light-transmitting property, using a metal material having low work function, e.g., an alkali metal, such as sodium or lithium, or an alkaline-earth metal, such as magnesium or calcium. Such films may be laminated together. The common electrode 60 is connected through the auxiliary line 50 or directly to the cathode contact portion connected to the cathode lead terminal (not shown). Each pixel electrode 10, the corresponding light-emitting portion 40, and the common electrode 60 constitute an organic EL element 70.

When a current is applied to such an organic EL device 1A, the current flowing through the organic EL elements 70 flows not only in the common electrode 60 but also in the auxiliary line 50. Thereby, in the cathode as a whole, the resistance is substantially decreased, and the conductivity is increased. Therefore, it is possible to eliminate uneven luminance due to the voltage drop caused by high resistance on the cathode side, and an organic EL device capable of displaying high quality images can be obtained.

A method of manufacturing the organic EL device 1A will now be described with reference to FIGS. 5A to 5E. It is to be noted that the conditions for the processes described in the manufacturing method below are merely examples, and the invention is not limited thereto.

Figure 5A:
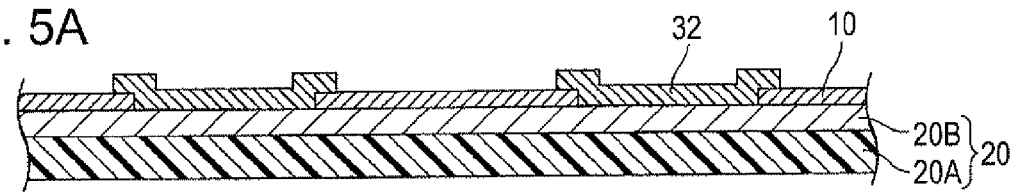
FIGS. 5A to 5E are cross-sectional views showing a method of manufacturing an organic EL device according to the first embodiment.

First, as shown in FIG. 5A, pixel electrodes 10 are formed on a substrate 20 including an element layer 20B formed on a substrate body 20A. Then, a first partition wall layer 32 is formed on the pixel electrodes 10. Each of these layers can be formed using a known method.

Figure 5B:
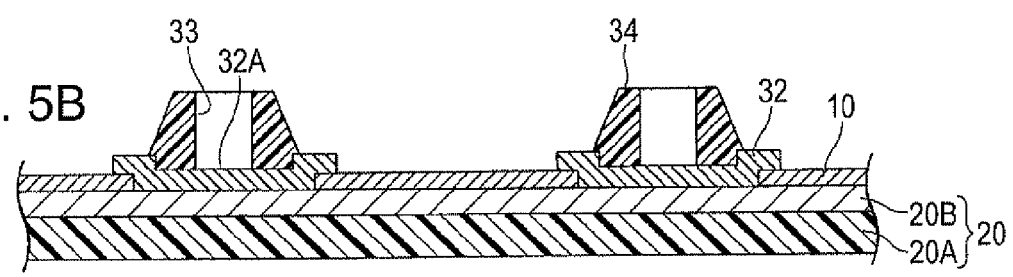

Next, as shown in FIG. 5B, a second partition wall layer 34 having a groove 33 is formed on the first partition wall layer 32, using a resin material. The second partition wall layer 34 may be formed by forming a partition wall not provided with a groove 33, and then making the groove 33 by etching. Alternatively, patterning may be performed by exposure through a mask that protects the groove 33 from light, for example, using a photocurable resin, so that the groove 33 is formed simultaneously with the formation of the second partition wall layer 34. The groove 33 reaches the first partition wall layer 32, and the first partition wall layer 32 is exposed to the bottom surface 32A of the groove 33. The width of the second partition wall layer 34 (width between the sidewall facing the groove 33 and the sidewall facing the pixel electrode 10) is preferably set to be larger than the margin of error in the positional accuracy when ejection is performed using an ink jet method so that selective application is ensured.

After the second partition wall layer 34 is formed, plasma treatment is performed on the entire workpiece under $O_2$ gas atmosphere, and then plasma treatment is performed under $CF_4$ gas atmosphere. First, by the $O_2$ plasma treatment, impurities are removed from the surfaces of the substrate 20 and the individual components disposed on the substrate 20, and thereby liquid-affinity is imparted to the surfaces. Next, by the $CF_4$ plasma treatment, liquid-repellency is imparted to the surface of the second partition wall layer 34. Since the $CF_4$ plasma treatment imparts liquid-repellency to organic substances, the surface of the partition wall layer 34 can be selectively made liquid-repellent. The second partition wall layer 34 is made liquid-repellent and the surfaces of the pixel electrodes 10 and the first partition wall layer 32 are made liquid-philic. The surface of the first partition wall layer 32 exposed to the bottom surface 32A of the groove 33 is also made liquid-philic.

Figure 5C:
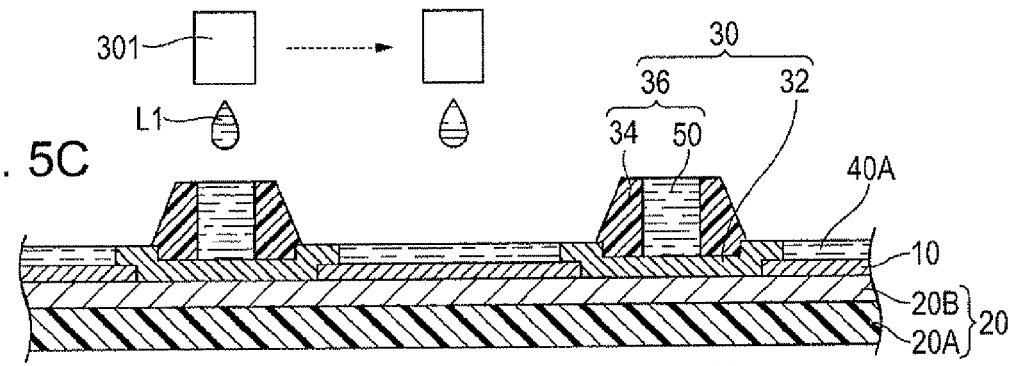

Next, as shown in FIG. 5C, a conductive ink L1 (PEDOT/PSS dispersion liquid) is applied into the groove 33 using a liquid droplet ejection head 301, followed by drying and firing. Thereby, an auxiliary line 50 is formed. Since the bottom surface of the groove 33 has been subjected to liquid-affinity-imparting treatment, the conductive ink L1 spreads well inside the groove 33, and the auxiliary line 50 can be reliably formed inside the groove 33. Furthermore, since the surface of the second partition wall layer 34 has been subjected to liquid-repellency-imparting treatment, the conductive ink L1 does not remain on the top of the second partition wall layer 34, and thus selective application can be performed. The auxiliary line 50 embedded in the groove 33 is integrated with the adjacent second partition wall layer 34 to constitute a common partition wall layer 36.

In this embodiment, the auxiliary line 50 is formed using PEDOT/PSS, which is the same conducting polymer as the material for forming the hole injection layer 40A. Consequently, simultaneously with the formation of the auxiliary line 50, the conductive ink L1 is applied onto the pixel electrode 10, and the hole injection layer 40A is formed by the same process. In such a manner, the auxiliary line 50 and the hole injection layer 40A can be formed simultaneously. Thus, it is possible to reduce the number of process steps compared with the case where each component is independently formed.

When the hole injection layer 40A and the auxiliary line 50 are formed using PEDOT/PSS, it may also be possible to change the type of the solvent of the conductive ink L1 so that electrical properties, such as resistance and work function, are optimized. Specifically, as the solvent for the functional liquid of PEDOT/PSS used for forming the auxiliary line 50, a mixed solvent of water and an organic substance may be used, the organic substance having a property of decreasing the resistance of the conductive material when mixed with water.

Since both PEDOT and PSS are dispersible in water, it is possible to perform the application using an aqueous dispersion liquid in which both are dispersed in water alone. However, it has been reported that when a mixed solvent of water and diethylene glycol (DEG), which is a protonic polar solvent, is used as the solvent for PEDOT/PSS rather than using water alone as the solvent, the resistance of the resulting PEDOT/PSS polymer layer is decreased, and conduction is facilitated (for example, refer to Chem. Mater., 18(18), 4354-4360, 2006).

This tendency changes depending on the type and ratio of the organic substance contained in the mixed solvent. Thus, by changing the mixing ratio or the type of solvent, the electrical properties can be optimized. As described in the known document [Yusaku Mori, "Yuki electronics no saisingijutsu doko (Latest technical trend of organic electronics), Laser printer de tsukuru plastic electronics (Plastic electronics produced by laser printer)", Densizairyo (Electronic Materials and Parts), Kogyo Chosakai Publishing, Inc., July 2007], it is possible to use, besides DEG, an organic substance having a plurality of hydroxyl groups (—OH groups) as in DEG, such as ethylene glycol (EG), polyethylene glycol, glycerol, or sorbitol; or a polar solvent which has strong salvation properties, such as dimethylsulfoxide. By setting the mixing ratio so as to be suitable for such an organic substance, the resistance of the PEDOT/PSS can be decreased.

When the hole injection layer 40A has a low resistance, the resistance of the organic EL element as a whole decreases, resulting in shortening of the life of the element. On the other hand, since the auxiliary line 50 is provided for assisting the electrical conduction of the common electrode 60, a material with low resistance should be used. With respect to such contradictory requirements for physical properties, by employing a mixed solvent in which the organic substance is mixed/dissolved as the solvent of the conductive ink L1 for forming the auxiliary line 50 by use of the nature of PEDOT/PSS, it is possible to form the hole injection layer 40A and the auxiliary line 50 having different resistances while using a common constituent material. In this embodiment, as the mixed solvent for the conductive ink for forming the auxiliary line 50, a mixed solvent in which the ratio of water to ethylene glycol is 1:1 is used.

Figure 5D:
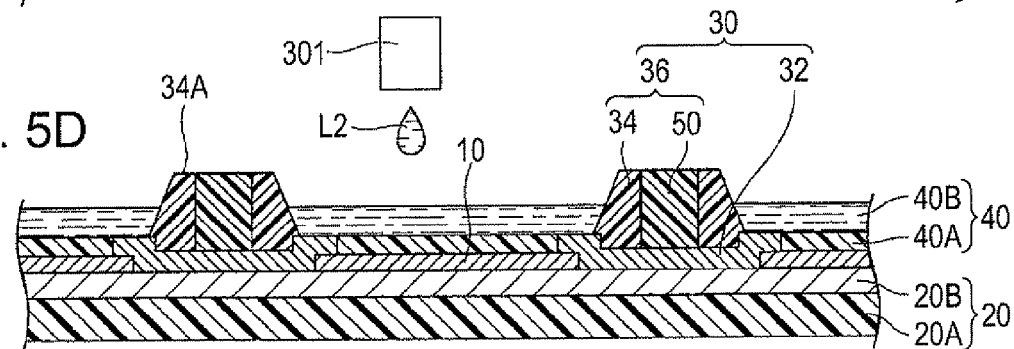

Next, as shown in FIG. 5D, a functional liquid L2 (functional liquid containing a luminescent layer-forming material) is applied onto the hole injection layer 40A using a liquid droplet ejection head 301, followed by drying and annealing. Thereby, a luminescent layer 40B is formed. The top surface 34A of the second partition wall layer 34 has been subjected to liquid-repellency-imparting treatment, and the auxiliary line 50 has been formed using PEDOT/PSS which is a resin material, thus being liquid-repellent compared with the case where the auxiliary line 50 is composed of a metal material. In addition, since the auxiliary line 50 is formed so as to be embedded in the groove 33, no recess is present on the top of the common partition wall layer 36. Therefore, the functional liquid L2 applied on the common partition wall layer 36 flows and placed in the hole injection layer 40A. Thereby, the luminescent layer 40B is formed.

Figure 5E:
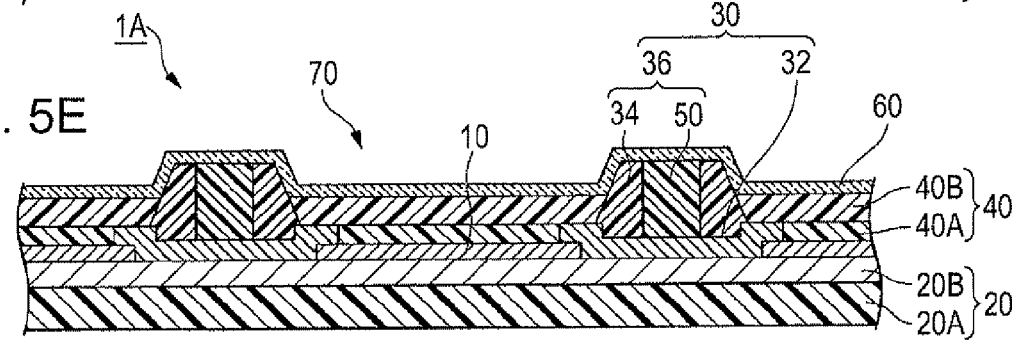

Next, as shown in FIG. 5E, a common electrode 60 is formed by vacuum deposition over the entire upper surface of the substrate 20. The resulting common electrode 60 is in contact with the auxiliary line 50 to achieve electrical conduction, and the common electrode 60 and the auxiliary line 50 as a whole function as a cathode. The organic EL elements 70 are manufactured as described above, and thereby, the organic EL device 1A is completed.

In the method of manufacturing the organic EL device 1A described above, since the top surface 34A has liquid-repellency, the conductive ink L1 or the functional liquid L2 is prevented from spreading or remaining on the top of the partition wall layer, and it is possible to apply different types of liquid satisfactorily using the liquid droplet ejection method, and thus each liquid can be applied to the corresponding pixel with accuracy. Furthermore, since the conductive ink L1 placed in the groove 33 spreads over the liquid-philic bottom surface 32A, the auxiliary line 50 can be reliably formed along the groove 33, and the auxiliary line 50 can be placed with high positional accuracy. Consequently, both placement of the auxiliary line 50 and application of different types of liquid to the corresponding pixels can be performed satisfactorily, and thus it is possible to manufacture a high-definition, high-quality organic EL device 1A without uneven luminance.

Furthermore, in this embodiment, the first partition wall layer 32 is composed of an inorganic material, and the second partition wall layer 34 is composed of an organic material. By forming each of the layer to which liquid-repellency is imparted and the layer to which liquid-affinity is imparted using the materials suitable for the corresponding properties, it is possible to easily control liquid-affinity and liquid-repellency, and the auxiliary line 50 can be formed reliably.

Furthermore, in this embodiment, the organic functional layer includes the hole injection layer 40A, and the auxiliary line 50 and the hole injection layer 40A are formed using the same organic functional material. Therefore, by using the common material, the manufacturing process and facilities can be simplified, and thus it is possible to manufacture a high-quality organic EL device 1A with reduced process load.

Furthermore, in this embodiment, in the process of forming the auxiliary line 50, the hole injection layer 40A is simultaneously formed. By simultaneously forming the auxiliary line 50 and the hole injection layer 40A, the number of process steps can be reduced, and it is possible to manufacture a high-quality organic EL device 1A with reduced process load.

Furthermore, in this embodiment, the conductive material is a mixture of polyethylenedioxythiophene (PEDOT) and polystyrene sulfonic acid (PSS), and the solvent contained in the conductive ink L1 is a mixed solvent of water and ethylene glycol. Since the resistance of PEDOT/PSS can be controlled by using such a mixed solvent and changing the mixing ratio of the mixed solvent, while using the same material for forming the auxiliary line 50 and the hole injection layer 40A, it is possible to distinguish the hole injection layer 40A having suitable resistance from the auxiliary line 50.

Furthermore, in this embodiment, before forming the luminescent layer 40B, the auxiliary line 50 is formed, and the groove 33 is filled with the resulting auxiliary line 50. Consequently, the recessed shape is eliminated from the top of the common partition wall layer 36. Even if the functional liquid L2 is placed on the common partition wall layer 36, the functional liquid L2 does not remain on the partition wall layer and flows into the openings corresponding to the light-emitting elements, and thus selective application can be performed satisfactorily. Consequently, it is possible to easily manufacture a high-quality organic EL device 1A.

Furthermore, in this embodiment, the liquid droplet ejection method is an ink jet method. Therefore, the functional liquids can be applied to the corresponding regions in a high-definition pattern, and thus it is possible to manufacture a high-resolution, high-quality organic EL device.

Although the functional liquids are applied using the ink jet method in this embodiment, a dispenser method may also be used.

Although the auxiliary line 50 and the hole injection layer 40A are formed simultaneously in this embodiment, each of the auxiliary line 50 and the hole injection layer 40A may be formed independently.

Although PEDOT/PSS is used for forming the auxiliary line 50 in this embodiment, a metal material may also be used. In such a case, examples of the metal material include gold, silver, copper, palladium, nickel, ITO, and oxides of these metals, and the conductive ink is a dispersion liquid in which fine particles of any of these metals and metal oxides are dispersed in a dispersion medium. In order to improve dispersibility, the surfaces of such metal fine particles may be coated using an organic substance or the like as a coating material.

The particle size of the metal fine particles is preferably in the range of 1 nm to 0.1 μm. If the particle size is larger than 0.1 μm, there is a possibility that clogging may occur in the nozzle 325 of the liquid droplet ejection head 301. If the particle size is smaller than 1 nm, the volume ratio of the coating material to the metal fine particles increases, thus increasing the possibility that inclusions derived from the coating material may remain to degrade the quality. The dispersion medium for the conductive ink is not particularly limited as long as it can disperse the metal fine particles and does not cause aggregation.

Furthermore, in this embodiment, the resistance of PEDOT/PSS, which is the material for forming the auxiliary line 50, is decreased by using a mixed solvent of water and ethylene glycol for application. However, it may also be possible to use an auxiliary line-forming material that has a higher resistivity than that of the material for forming the common electrode 60. In such a case, by increasing the thickness and width of the auxiliary line 50 so that the conductor cross-sectional area is increased, it is possible to form an auxiliary line 50 having a sheet resistance smaller than that of the common electrode 60. Thereby, the auxiliary line 50 can fully display the function of assisting the electrical conduction of the common electrode 60.

In this embodiment, the auxiliary line 50 and the hole injection layer 40A are formed using the common conductive material, i.e., PEDOT/PSS. However, instead of PEDOT/PSS, another conductive material having hole-transporting capability can be used.

Examples of such a conductive material include polyaniline represented by Chemical Formula 1 below, a polythiophene derivative represented by Chemical Formula 2 (e.g., Espacer 100 manufactured by TA Chemical Co., Ltd.), a self-doped polyisothianaphthene represented by Chemical Formula 3 (e.g., Espacer 300 manufactured by TA Chemical Co., Ltd.), and a polypyrrole represented by Chemical Formula 4 doped with a dopant represented by Chemical Formula 5. Here, as an example of polypyrrole, a copolymer of ethyl 3-methyl-4-pyrrolecarboxylate and butyl 3-methyl-4-pyrrolecarboxylate is shown, and as a dopant to polypyrrole, 2,3,6,7-tetracyano-1,4,5,8-tetraazanaphthalene (TCNA) is shown.

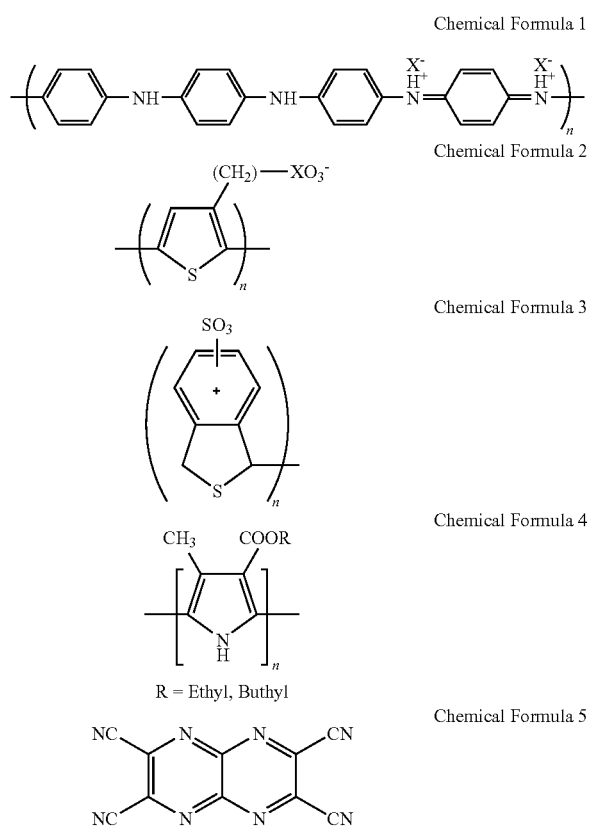

Even by using any of these conductive materials, the auxiliary line 50 and the hole injection layer 40A can be formed using the same material.

Second Embodiment

Figure 6:
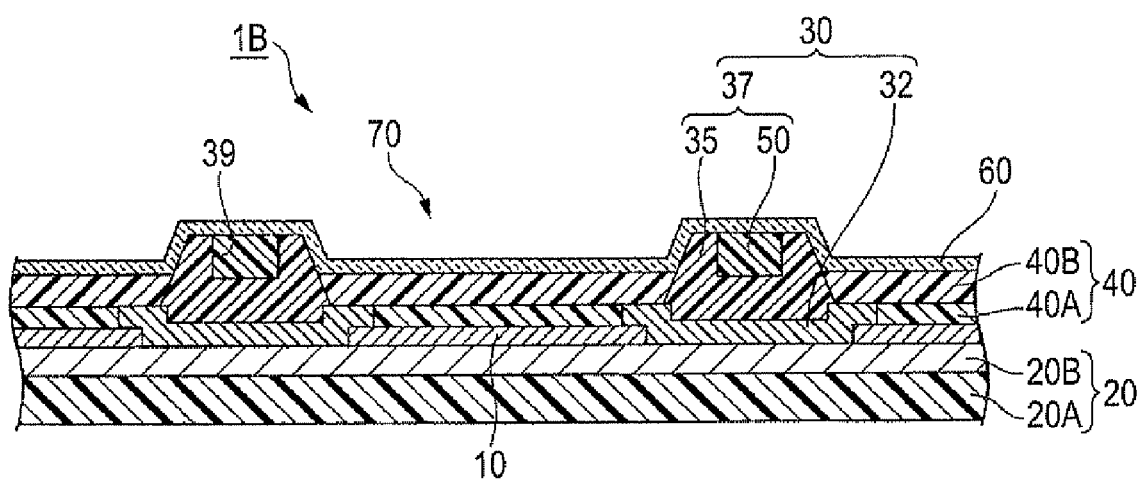
FIG. 6 is a schematic cross-sectional view of an organic EL device according to a second embodiment.
Figure 7A:
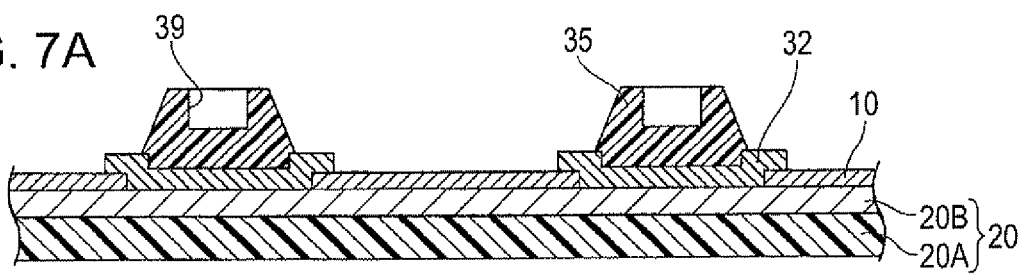
FIGS. 7A to 7C are cross-sectional views showing a method of manufacturing an organic EL device according to the second embodiment.
Figure 7B:
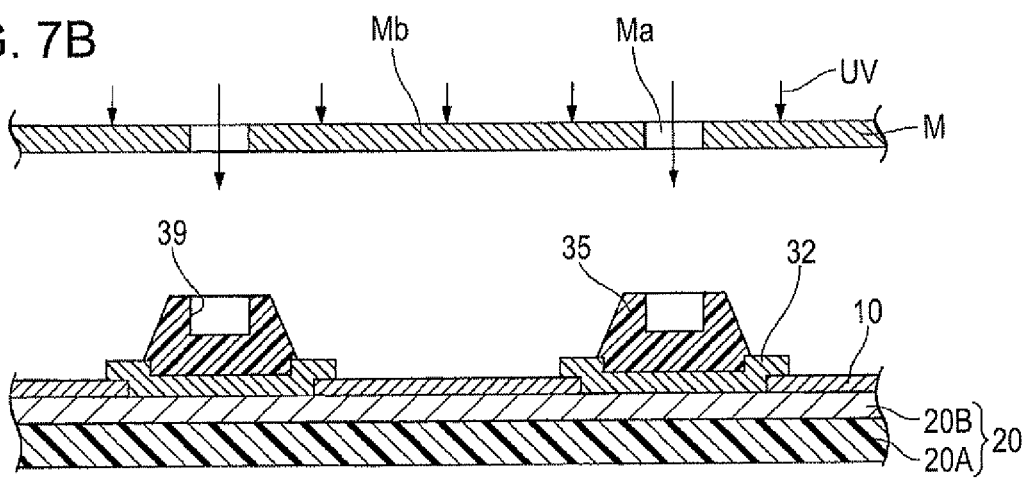
Figure 7C:
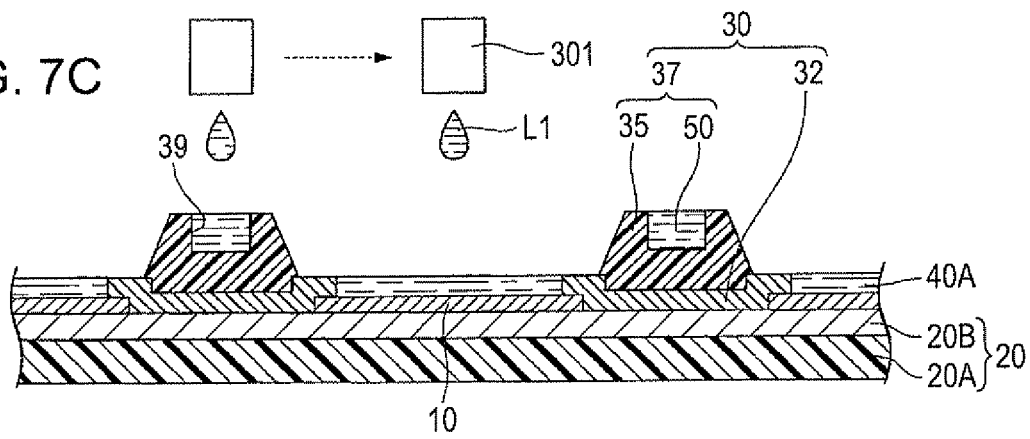

FIGS. 6 to 7C are schematic views showing a method for manufacturing an organic EL device according to a second embodiment of the invention. The method for manufacturing an organic EL device according to the second embodiment is the same as that in the first embodiment except that the first partition wall layer 32 is not exposed to the bottom of the groove in which the auxiliary line 50 is disposed. Consequently, the same components or parts as those of the first embodiment are designated by the same reference numerals, and detailed description thereof is omitted.

FIG. 6 is a cross-sectional view of an organic EL device 1B manufactured by the method for manufacturing an organic EL device according to the second embodiment.

As shown in FIG. 6, a partition wall layer 30 of the organic EL device 1B includes a first partition wall layer 32 and a common partition wall layer 37 disposed on the first partition wall layer 32. The common partition wall layer 37 includes a second partition wall layer 35 having a groove 39 on the top thereof and an auxiliary line 50 formed so as to fill the groove 39.

A method of manufacturing the organic EL device 1B will now be described with reference to FIGS. 7A to 7C. It is to be noted that the conditions for the processes described in the manufacturing method below are merely examples, and the invention is not limited thereto. Description of the process steps common to those in the first embodiment will be omitted.

First, as shown in FIG. 7A, a second partition wall layer 35 having a groove 39 is formed, using a resin material, on a first partition wall layer 32. The first partition wall layer 32 partially rises and overlaps the periphery of the pixel electrode 10. Thus, in the first partition wall layer 32, the portion overlapping the pixel electrode 10 and the portion not overlapping the pixel electrode 10 have different heights from the surface of the substrate 20. The first partition wall layer 32 has a cross section having a recessed center portion. When the second partition wall layer 35 is formed on the first partition wall layer 32 having such a cross-sectional shape, the top of the second partition wall layer follows the shape of the underlying first partition wall layer 32, and thereby a groove 39 is formed. The groove 39 formed as described above may be further etched to increase the depth. After the second partition wall layer 35 is formed, plasma treatment is performed on the entire workpiece under $O_2$ gas atmosphere, and then plasma treatment is performed under $CF_4$ gas atmosphere so that the surface is subjected to liquid-affinity-imparting treatment and liquid-repellency-imparting treatment.

Next, as shown in FIG. 7B, ultraviolet light UV is applied to the surface through a mask M having an opening Ma at the position corresponding to the groove 39. Thereby, the inside of the groove 39 exposed to ultraviolet light UV loses liquid-repellency, and the region which is covered with a light-shielding portion Mb and not exposed to ultraviolet light UV maintains liquid-repellency. Therefore, a liquid-philic and liquid-repellent pattern can be formed inside and outside the groove 39.

Next, as shown in FIG. 7C, a conductive ink L1 is applied into the groove 39 using a liquid droplet ejection head 301, followed by drying and firing. Thereby, an auxiliary line 50 is formed. The conductive ink L1 spreads well inside the groove 39 using the difference in liquid-affinity and liquid-repellency inside and outside the groove 39, and the difference in level of the groove 39. Consequently, the auxiliary line 50 can be reliably formed inside the groove 39. The conductive ink L1 is also applied onto the pixel electrode 10 thereby to form a hole injection layer 40A.

A luminescent layer 40B and a common electrode 60 are formed by the same process as in the first embodiment. Thereby, an organic EL device 1B shown in FIG. 6 is obtained.

In the method for manufacturing the organic EL device 1B described above, it is also possible to form the auxiliary line satisfactorily using selective application by the liquid droplet ejection method, and a high-definition, high-quality organic EL device 1B without uneven luminance can be manufactured.

In this embodiment, the liquid-philic and liquid-repellent pattern is formed by applying UV into the groove 39. However, the auxiliary line 50 may be formed by placing the conductive ink L1 inside the groove 39 using only the physical difference in level of the groove 39.

Third Embodiment

Figure 8:
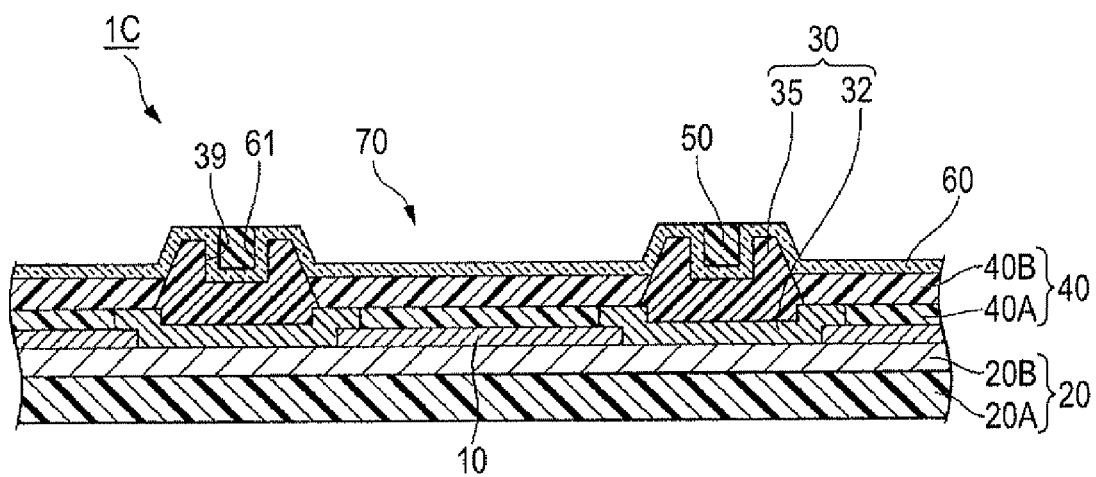
FIG. 8 is a schematic cross-sectional view of an organic EL device according to a third embodiment.

FIG. 8 is a schematic view showing a method for manufacturing an organic EL device according to a third embodiment of the invention. The method for manufacturing an organic EL device according to the third embodiment is the same as that in the second embodiment except that the common electrode 60 is disposed before the auxiliary line 50 is placed in the recess. Consequently, the same components or parts as those of the first embodiment are designated by the same reference numerals, and detailed description thereof is omitted.

FIG. 8 is a cross-sectional view of an organic EL device 1C manufactured by the method for manufacturing an organic EL device according to the third embodiment.

As shown in FIG. 8, a partition wall layer 30 of the organic EL device 1C includes a first partition wall layer 32 and a second partition wall layer 35 disposed on the first partition wall layer 32. A common electrode 60 is disposed over a luminescent layer 40B so as to cover the internal surface of a groove 39. In the common electrode 60, the portion which overlaps the groove 39 in plan view follows the shape of the underlying groove 39, and thereby a groove 61 is formed. The auxiliary line 50 is formed so as to be embedded in the groove 61.

A method of manufacturing the organic EL device 1C will now be described with reference to FIGS. 9A to 9D. First, as shown in FIG. 9A, a second partition wall layer 35 having a groove 39 is formed, using a resin material, on a first partition wall layer 32, the first partition wall layer 32 and the second partition wall layer 35 constituting a partition wall layer 30. Using a liquid droplet ejection head 301, a conductive ink L1 and a functional liquid L2 are applied onto regions surrounded by the partition wall layer 30, thereby to form light-emitting portions 40.

Next, as shown in FIG. 9B, a common electrode 60 is formed by a known method, such as vacuum deposition, over the luminescent layer 40B so as to cover the internal surface of the groove 39 in the second partition wall layer 35. In the common electrode 60, the portion which overlaps the groove 39 in plan view follows the shape of the underlying groove 39, and thereby a groove 61 is formed.

Next, as shown in FIG. 9C, ultraviolet light UV is applied to the surface through a mask M having an opening Ma at the position corresponding to the groove 61 to make the inside of the groove 61 liquid-philic. Thereby, a liquid-philic and liquid-repellent pattern is formed inside and outside the groove 61.

Next, as shown in FIG. 9D, a conductive ink L1 is applied into the groove 61 using a liquid droplet ejection head 301 to form an auxiliary line 50. Thereby, an organic EL device 1C is obtained.

In the method for manufacturing the organic EL device 1C described above, it is also possible to form the auxiliary line satisfactorily using selective application by the liquid droplet ejection method, and a high-definition, high-quality organic EL device 1C without uneven luminance can be manufactured.

Electronic Apparatus

Figure 10:
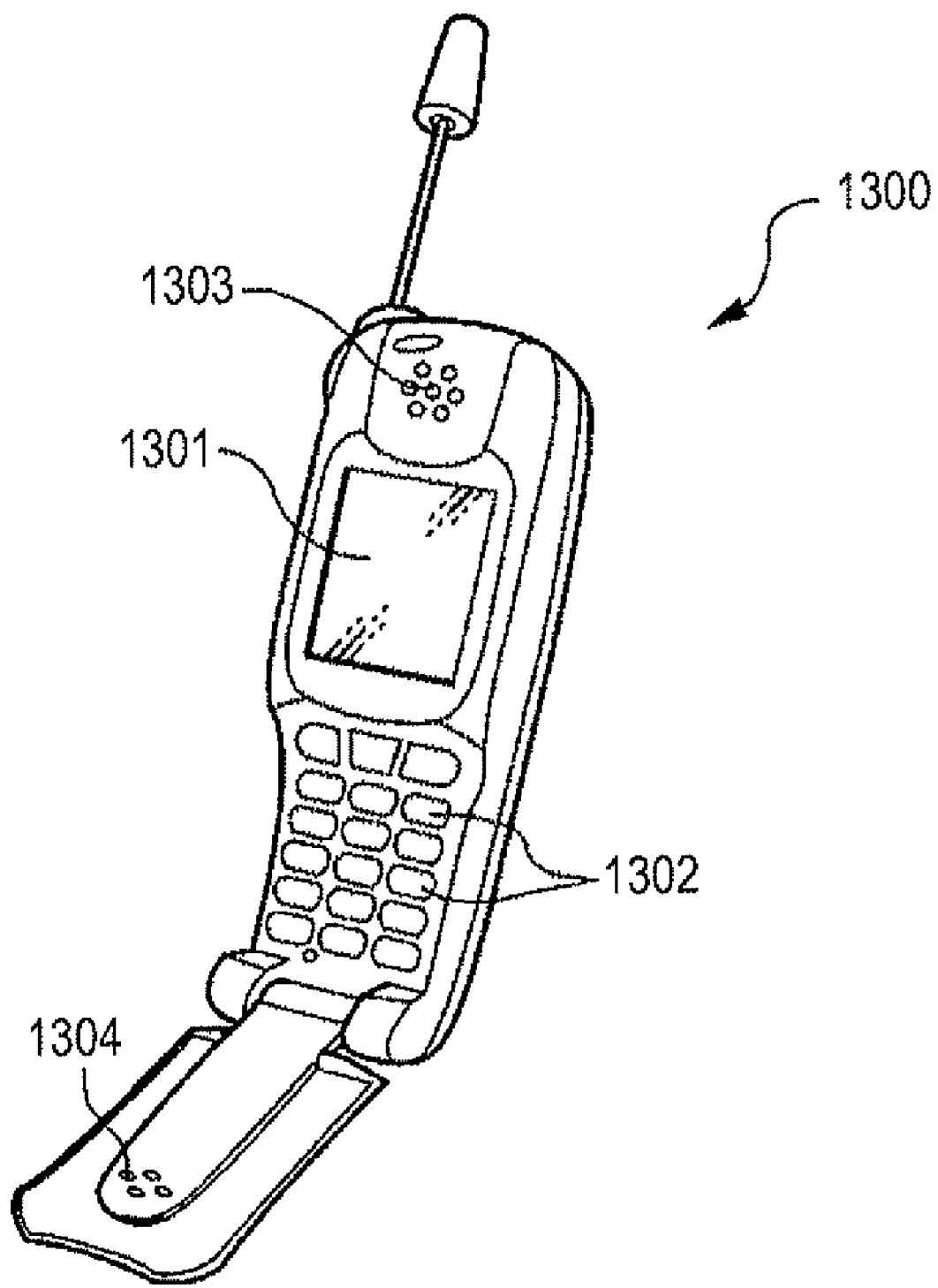
FIG. 10 is a schematic perspective view showing an electronic apparatus including an organic EL device according to an embodiment of the invention.

An electronic apparatus according to an embodiment of the invention will now be described. FIG. 10 is a perspective view showing an example of an electronic apparatus using an organic EL device according to an embodiment of the invention. A mobile phone 1300 shown in FIG. 10 includes an organic EL device according to an embodiment of the invention as a small display unit 1301, a plurality of operation buttons 1302, an earpiece 1303, and a mouthpiece 1304. Thereby, it is possible to provide a mobile phone 1300 having a display unit which is constituted by an organic EL device according to an embodiment of the invention and which has excellent display quality.

Besides the mobile phone, the organic EL devices according to the embodiments described above can be suitably used as image-displaying units for various types of electronic apparatuses, such as electronic books, projectors, personal computers, digital still cameras, televisions, viewfinder type or monitor-direct-view type video tape recorders, car navigation systems, pagers, electronic pocket diaries, desktop electronic calculators, word processors, workstations, television telephones, POS terminals, and apparatuses provided with touch panels. In such structures, it is possible to provide electronic apparatuses having display units with high display quality and high reliability.

Furthermore, the organic EL devices according to the embodiments described above can be used as line heads, and the line heads can be suitably used as light sources for image-forming apparatuses (optical printers). In such cases, it is possible to produce optical printers which is free from uneven luminance and in which exposure defects hardly occur.

Although the preferred embodiments of the invention have been described above with reference to the accompanying drawings, it is to be understood that the invention is not limited thereto. The shapes, combinations, etc. of the components shown in the above embodiments are merely examples, and various modifications can be made on the basis of design requirements, etc. as long as they do not deviate from the scope of the invention.

The entire disclosure of Japanese Patent Application Nos: 2008-044374, filed Feb. 26, 2008 and 2008-238966, filed Nov. 13, 2008 are expressly incorporated by reference herein.

What is claimed is:

1. A method of manufacturing an organic electroluminescence device including:

light-emitting elements including a first electrode, each of the light-emitting elements having second electrodes and an organic functional layer disposed between the first electrode and the corresponding one of the second electrodes, the organic functional layer including a luminescent layer;

a partition wall layer extending so as to follow a gap between the light-emitting elements; and an auxiliary line connected to one of the first and second electrodes so as to assist electrical conduction to the light-emitting elements, the method comprising:

forming the partition wall layer;

forming a groove in the top of the partition wall layer;

subjecting the inside of the groove to liquid-affinity-imparting treatment;

subjecting at least the top of the partition wall layer to liquid-repellency-imparting treatment;

forming the auxiliary line to extend following the groove by using a liquid droplet ejection method to eject a conductive ink, in which a conductive material is dissolved or dispersed in a solvent, into the groove; and forming the one of the electrodes in contact with the auxiliary line.

2. A method of manufacturing an organic electroluminescence device including:

light-emitting elements including a first electrode, each of the light-emitting elements having a pair of electrodes and an organic functional layer disposed between the first electrode and the corresponding one of the second electrodes, the organic functional layer including a luminescent layer;

a partition wall layer extending so as to follow a gap between the light-emitting elements; and an auxiliary line connected to one of the first and second electrodes so as to assist electrical conduction to the light-emitting elements, the method comprising:

forming the partition wall layer;

forming a groove in the top of the partition wall layer;

forming the first electrode over and into the groove such that the electrode follows a cross-sectional shape of the underlying groove so that the first electrode has an indentation that corresponds to the groove;

subjecting the surface of the first electrode in the indentation to liquid-affinity-imparting treatment; and forming the auxiliary line to extend following the indentation in the first electrode by ejecting, using a liquid droplet ejection method, a conductive ink, in which a conductive material is dissolved or dispersed in a solvent.

3. The method of manufacturing an organic electroluminescence device according to claim 1, wherein the partition wall layer includes a first partition wall layer having openings corresponding to the light-emitting elements and a second partition wall layer which is disposed on the first partition wall layer, and extending so as to follow the gap of the light-emitting elements, and has the groove on the top thereof;

the forming the partition wall layer includes forming the first partition wall layer and forming the second partition wall layer on the first partition wall layer such that the first partition wall layer is exposed at the bottom of the groove; and the first partition wall layer is composed of an inorganic material, and the second partition wall layer is composed of an organic material.

4. The method of manufacturing an organic electroluminescence device according to claim 1, wherein the organic functional layer includes a hole injection layer, the conductive material being the same as a material for forming the hole injection layer.

5. The method of manufacturing an organic electroluminescence device according to claim 1, wherein the organic functional layer includes a hole injection layer, the conductive material for forming the auxiliary line being the same as a material for forming the hole injection layer, the hole injection layer being formed using the liquid droplet ejection method during the same process as forming the hole injection layer.

6. The method of manufacturing an organic electroluminescence device according to claim 5, wherein the conductive material is a mixture of polyethylenedioxythiophene and polystyrene sulfonic acid;

the solvent is a mixed solvent of water and an organic substance that decreases the resistance of the conductive material when mixed with water; and the resistance of the conductive material is controlled by changing the mixing ratio of the mixed solvent.

7. The method of manufacturing an organic electroluminescence device according to claim 1, the auxiliary line being formed before forming the organic functional layer, the auxiliary line filled the groove.

8. The method of manufacturing an organic electroluminescence device according to claim 1, wherein, before forming the auxiliary line, a region in which the conductive ink is to be placed is selectively irradiated with ultraviolet light.

9. The method of manufacturing an organic electroluminescence device according to claim 1, wherein the liquid droplet ejection method is an ink jet method.

10. The method of manufacturing an organic electroluminescence device according to claim 2, wherein the partition wall layer includes a first partition wall layer having openings corresponding to the light-emitting elements and a second partition wall layer which is disposed on the first partition wall layer, and extending so as to follow the gap of the light-emitting elements, and has the groove on the top thereof;

the forming the partition wall layer includes forming the first partition wall layer and forming the second partition wall layer on the first partition wall layer such that the first partition wall layer is exposed at the bottom of the groove; and the first partition wall layer is composed of an inorganic material, and the second partition wall layer is composed of an organic material.

11. The method of manufacturing an organic electroluminescence device according to claim 2, wherein the organic functional layer includes a hole injection layer, the conductive material being the same as a material for forming the hole injection layer.

12. The method of manufacturing an organic electroluminescence device according to claim 2, wherein the organic functional layer includes a hole injection layer, the conductive material for forming the auxiliary line being the same as a material for forming the hole injection layer, the hole injection layer being formed using the liquid droplet ejection method during the same process as forming the hole injection layer.

* * * * *